(12) United States Patent
Williams

(10) Patent No.: US 6,222,389 B1
(45) Date of Patent: Apr. 24, 2001

(54) ASSISTED GUNNING TRANSCEIVER LOGIC (AGTL) BUS DRIVER

(75) Inventor: Robert Russell Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/275,774

(22) Filed: Mar. 25, 1999

(51) Int. Cl.$^7$ ................. H03K 17/16; H03K 19/0175
(52) U.S. Cl. ................. 326/86; 326/26; 326/27; 326/17; 326/87; 326/30
(58) Field of Search ................. 326/26, 27, 30, 326/80, 86, 87, 81, 90, 91, 17

(56) References Cited

U.S. PATENT DOCUMENTS

| | | | |
|---|---|---|---|
| 5,023,488 | 6/1991 | Gunning | 307/475 |
| 5,680,062 * | 10/1997 | Lee et al. | 326/63 |
| 5,729,154 | 3/1998 | Taguchi et al. | 326/30 |
| 5,760,606 * | 6/1998 | Hirano et al. | 326/81 |
| 5,767,695 | 6/1998 | Takekuma et al. | 326/30 |
| 5,784,599 | 7/1998 | Elkhoury | 395/556 |
| 5,818,253 | 10/1998 | Takekuma et al. | 326/30 |
| 5,818,260 | 10/1998 | Kuo | 326/86 |
| 5,821,767 * | 10/1998 | Osaka et al. | 326/30 |
| 5,831,467 | 11/1998 | Leung et al. | 327/319 |
| 5,852,372 | 12/1998 | Boeckmann et al. | 326/83 |
| 5,917,758 * | 6/1999 | Keeth | 365/189.05 |
| 5,949,252 * | 9/1999 | Taguchi | 326/86 |
| 5,982,192 * | 11/1999 | Saito | 326/30 |
| 6,014,037 * | 1/2000 | Gabara et al. | 326/30 |
| 6,026,456 * | 2/2000 | Ilkbahar | 710/101 |

OTHER PUBLICATIONS

"Intel® Pentium® II Xeon™ Processor Bus Terminator Design Guidelines," Release Date: Jul. 1998.

* cited by examiner

Primary Examiner—Michael Tokar
Assistant Examiner—Vibol Tan
(74) Attorney, Agent, or Firm—Christopher H. Lynt

(57) ABSTRACT

A driver for a signal line provides a desired pull-up voltage, different from a natural supply voltage, and desired terminating impedance. The driver forms a controllable split terminator voltage divider.

20 Claims, 5 Drawing Sheets

Thevenized Assisted GTL Driver

Assisted GTL bus with five drops

Conventional Assisted GTL Driver

Thevenized Assisted GTL Driver

Assisted GTL bus with five drops

ASSISTED GUNNING TRANSCEIVER LOGIC (AGTL) BUS DRIVER

BACKGROUND OF THE INVENTION

1. Field of the Invention

The invention relates to the field of bus drivers, and in particular, to a Thevenized assisted gunning transceiver logic (AGTL) bus driver to avoid 1.5 volt power supply requirements.

2. Background Information

Digital computer systems and the like often include a plurality of integrated circuits (IC's), for example, VLSI (very large scale integration) circuits, which are interconnected for conducting digital communications by transmission lines. Drivers (transmitters) and receivers are provided to interface the VLSI components of such systems to the transmission lines. A combined transmitter (driver) and receiver circuit is called a transceiver.

The transmission lines are conventionally traces which are formed on a suitable substrate, such as a PCB (printer circuit board). For example, so-called microstrip traces and strip line traces can be employed to form transmission lines having characteristics impedances on the order of about 50 ohms to 70 ohms. In keeping with standard practices, such transmission lines have their opposite ends terminated in their characteristic impedance (50 to 70 ohms). Thus, the output load on a driver for such a transmission line may be as low as 25 ohms to 35 ohms. or so, i.e., the effective resistance of the parallel resistive terminations of 50 to 70 ohms at each end of the transmission line (disregarding other loads on the bus).

CMOS technology is attractive for fabricating VLSI circuits having relatively high gate densities, but the nominal rail-to-rail voltage swing (nominally, 0 to 5 volts) of standard CMOS circuits tends to cause the output drivers for such circuits to dissipate excessive amounts of power internally whenever the drivers are working into low impedance loads, such as terminated transmission lines of the above-described type. The need for relatively low power drivers and for compatible receivers which could be economically and reliably implemented in existing CMOS technology for interfacing VLSI CMOS circuits to relatively low impedance terminated transmission lines was addressed by William F. Gunning with his so-called "Gunning Transceiver Logic" or GTL.

Gunning transceiver logic (GTL) and bus design are disclosed in U.S. Pat. No. 5,023,488, which issued Jun. 11, 1991, which can be consulted for additional background information. Briefly, the Gunning patent describes very wide channel, open drain, N-channel CMOS (complementary metal oxide semiconductor) drivers and cascade CMOS receivers for interfacing VLSI (very large scale integrated) CMOS circuits to transmission lines, which are terminated by their characteristic resistive impedances, to voltage levels on the order of about 1.2 volts–2.0 volts. These GTL (Gunning Transceiver Logic) drivers and receivers typically operate with a voltage swing on the order of about 0.8 volts–1.4 volts on such transmission lines for carrying out binary communications between CMOS circuits configured to operate with standard 5 volts rail-to-rail voltage swings for their internal signals.

In a practical implementation, the GTL bus can take the form of a transmission line on a circuit board (bus and transmission line may be used interchangeably herein). The GTL bus/transmission line is generally terminated at both ends with a pull-up resistor to the VDD voltage which is usually 1.2 to 1.5 volts. The bus terminating resistors are generally 70 to 100 ohm resistors, therefore, the effective driver load may be as low as 35 ohms (not considering the device loads that may be present). In the field of transmission lines, to reduce problems with signal reflections, for example, it is well known that the signal lines should be terminated with resistors having a resistance value equal to the characteristic impedance of the bus.

By definition, the characteristic impedance of a transmission line is the ratio of the voltage and current at any point on the line, for an infinitely long line, i.e., a line with no reflected waves. The characteristic impedance of a particular line at a particular frequency is dependent on its physical properties, e.g., the inherent resistance, conductance, capacitance and inductance per unit length of the conductors and insulators, and on its design, e.g., the spacing between the conductors. According to transmission line theory, when a line is resistively terminated with its characteristic impedance, there are no reflected waves, and maximum power transfer can take place. However, depending on the length of the line/bus, the capacitive loads due to devices on the line/bus, etc., the characteristic impedance of the line/bus is affected. The result of an overloading the bus is that less than optimal power transfer can be achieved, and signal degradation will result. To deal with this problem, assisted Gunning transceiver logic was developed.

Assisted Gunning transceiver logic (AGTL) differs from conventional Gunning transceiver logic (GTL) in that the AGTL driver "assists" the bus terminators in pulling the bus up to the specified voltage. That is, when a particular driver gets control of the bus and puts a "1" on the bus, the driver actively drives the bus to 1.5 volts (the same voltage as the terminators are tied to) with approximately the characteristic impedance, e.g., 40 ohms. This assists in pulling up the bus to the specified voltage, as well as providing a local termination on the bus stub that the driver is on, thereby damping overshoot.

As computer performance demands increase, new, higher speed logic with increased density is developed to fulfill these needs. To reduce overall power dissipation, modern microprocessors and associated circuits are being designed with lower voltage implementations, which in turn, requires power supplies to provide lower voltages with higher current capacities.

For example, Pentium® II Xeon™ processors have unique requirements for voltages supplied to them. Their bus implementation in particular, called the "assisted gunning transceiver logic +" (AGTL+) bus, requires a particular voltage level (1.5 volts).

The AGTL bus type is planned to have a prominent role in future Intel® products. For example, AGTL is also currently the interface used as the Intel® Merced™ processor bus. The Merced™ processor is a 64-bit processor and the first in the Intel® IA-64™ product family. This processor incorporates performance enhancing processing architecture techniques, such as explicit parallelism, predication and speculation. In explicit parallelism, at compile time, parallelism opportunities are identified in the software which allows for an optimal structuring of machine code to deliver maximum instruction level parallelism before execution, significantly enhancing processor utilization.

Briefly, predication relates to branch prediction, and in particular, to avoiding a wrong branch prediction which results in the purge of an instruction pipeline. In predication, branch paths are assigned special flags called predicate registers, e.g., "p1" for a "then" path, and "p2" for an "else" path. At run time, a compare statement stores a true or false value in the predicate registers. Both paths are then executed by the processor, however, only results from the path with a true predicate flag are used. Branches, and the possibility of associated mispredicts, are removed, the pipeline remains full, and performance is increased. Studies suggest that predication can reduce the number of branches by more than 50% and reduce the number of mispredicts by as much as 40%.

Speculation is directed at overcoming memory latency. Traditional architectures allow memory loads to be scheduled before the data is needed to reduce memory latency, that is, the processor time wasted while slower memory provides data needed by the faster processor. However, branches and other exceptions in instruction flow are a barrier to this pre-loading of data from memory. In speculation, memory loads are speculatively scheduled even in instruction streams with branches. If an exception occurs, this event is stored and a "check.s" instruction causes the exception to be processed. This elevation of the load allows more time to account for memory latency without stalling the processor pipeline.

The AGTL bus has a specified terminating impedance, e.g., 40 ohms, on the extreme ends of the bus which provide pull-up and transmission line termination. FIG. 1 shows a conventional AGTL driver arrangement. The driver/terminators, e.g., P1 101 and R1 102, pull the bus 109 to 1.5 volts (Vdd2 105).

The drivers assist are controlled by a pull-up assist signal at a control terminal 107 which switches in Vdd2 105 (1.5 volts) pulling the bus up to the specified 1.5 volts, i.e., actively driving the bus to the required 1.5 volts. Similarly, a pull-down signal at a control terminal 108 of the switching device (N1) 103 in pull-down path R2 104 and N1 103, serves to pull-down the bus 109 to ground (Gnd) 106. For pull-down, a lower resistance path (approximately 7 ohms) is provided.

Intel® provides an example of an AGTL+ processor bus system termination for a four-way symmetric multi-processing (SMP) design in literature for the Intel® Pentium® II Xeon™ processor available from their web site. In that example, which is shown in FIG. 4, all processor system bus AGTL+ signals on bus 409 are tied to 1.5 volts (Vtt) through a 150 ohm resistor (402), so that the bus 409 maintains a 25 ohm load impedance no matter what configuration is used in the five available slots 410 (the 25 ohms is derived from the six 150 ohm resistors 402 in parallel).

Actually, there are "AGTL" variants, all of which are Intel® "dialects" for a particular associated processor chip. The Xeon™ described above has the 150 ohm pull-ups distributed and always on. On the other hand, the Intel® "Merced" has 40 ohm card resistors at the ends of the bus line, with transiently applied 40 ohm pull-ups, such as are shown in FIG. 1. That is, a 40 ohm pull-up on each driver is enabled for a brief period when the driver relinquishes the bus, or changes from driving a logic level zero to driving a logic level one. The Intel "Foster" also has transiently-applied 40 ohm pull-ups such as in FIG. 1, but the end devices leave them on all the time so that card 40 ohm resistors aren't needed.

It should be appreciated that one the one hand, terminating a line with a resistance value equal to the characteristic impedance is preferred for avoiding signal reflections. However, it should also be appreciated that if terminating resistances are too low, too much current may be required to keep the bus signal lines at the required pull-up voltage level, i.e., the low resistances too heavily load the bus. Further, while the 1.5 volt specified for the AGTL bus may be advantageous for the design reasons mentioned earlier, it presents some design challenges as well.

Driver circuits are typically packaged in integrated circuits also called "chips" herein. If the driver chip naturally has a connection for the specified 1.5 volts on it, i.e., is already designed that way, there is no design problem because the driver/terminator can simply be connected to the 1.5 volts. However, currently many driver chips use 1.8 volts as their "natural" supply connection. Often the driver chip also has to have a second (higher) supply to interface to older technologies.

For example, SA27 (CMOS 7S product SA27) has two supplies, which are usually allocated to 1.8 volts (natural) and the older 2.5 volts. The SA27 product is an IBM ASIC (application specific integrated circuit) family. It is a family of chips of different sizes and number of inputs/outputs (I/O's). The user would design logic function using circuits from the SA27 "library," which then are placed and routed on the SA27 image. However, bringing in yet a third supply voltage connection to provide the 1.5 volts becomes very difficult, for example, in terms of the number of chip and module pins that will be required.

If an original equipment manufacturer (OEM) or other system designer wants to use the Intel® Merced™ processor, for example, an AGTL driver which is compliant with the AGTL voltage (1.5 volts) and impedance (40 ohms) specifications is required. Using such a bus is desirable for designers and manufacturers of the next generation of systems and servers, such as the International Business Machines Corporation (IBM®). However, as suggested above, unless a particular driver chip already has a connection for a 1.5 volt supply, it may be very difficult to provide.

Therefore, a need exists for a way to permit the use of the existing "natural" supply voltage of existing drivers with the AGTL bus.

SUMMARY OF THE INVENTION

It is, therefore, a principle object of this invention to provide a bus driver.

It is another object of the invention to solve the above mentioned problems so that bus voltage and impedance requirements can be met while at the same time the natural supply voltage in the bus driver can be used.

These and other objects of the present invention are accomplished by the method and apparatus disclosed herein.

According to an aspect of the invention, a pull-up assist driver circuit is provided which uses the natural power supply voltage of the chip. This driver terminator will have a gated resistance to the natural supply, e.g., 1.8 volts, and a gated resistance to ground (Gnd). The parallel combination of these resistances is set to be the desired termination resistance, and the ratio of the resistances are set to make the Thevenized voltage 1.5 v.

According to an aspect of the invention, driver for a signal line includes a circuit coupled to the line and coupled to a voltage source having a first voltage level (Vdd) and a second voltage level (Gnd). The circuit selectively provides a pull-up voltage level (1.5) different from the first voltage level (1.8) and the second voltage level (Gnd), to the signal line. The circuit further terminates the signal line with a predetermined impedance.

According to an aspect of the invention, the circuit includes a Thevenized split terminator. The split terminator includes a first switching device (P1), having a first terminal coupled to the first voltage level (1.8 VDD), a second terminal for receiving a pull-up assist signal, and a third terminal which is selectively electrically connected and disconnected to the first voltage level through the respective first terminal under control of the pull-up assist signal. A first impedance (R1) is coupled between the third terminal of the first switching device (P1) and the signal line. A second switching device (N2) is provided having a first terminal coupled to the second voltage level (GND), a second terminal for receiving the pull-up assist signal, and a third terminal which is selectively electrically connected and disconnected to the second voltage level through the respective first terminal under control of the pull-up assist signal. A second impedance (R3) is coupled between the third terminal of the second switching device (N2) and the signal line.

According to an aspect of the invention, the driver circuit further includes a third switching device (N1), having a first terminal coupled to the second voltage level (GND), a second terminal for receiving a pull-down signal, and a third terminal which is selectively electrically connected and disconnected to the second voltage level through the respective first terminal under control of the pull-down signal. A third impedance (R2) is coupled between the third terminal of the third switching device (N1) and the signal line.

According to another aspect of the invention, the first and second switching devices are controlled by the pull-up assist signal to electrically connect their respective third terminals to the respective voltage levels at substantially the same time. In this way, the first and second impedances and first and second switching devices act as a voltage divider to selectively provide the pull-up voltage level (1.5), different from the first voltage level (1.8) and the second voltage level (Gnd), to the signal line, and terminate the signal line with a predetermined impedance.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 1:
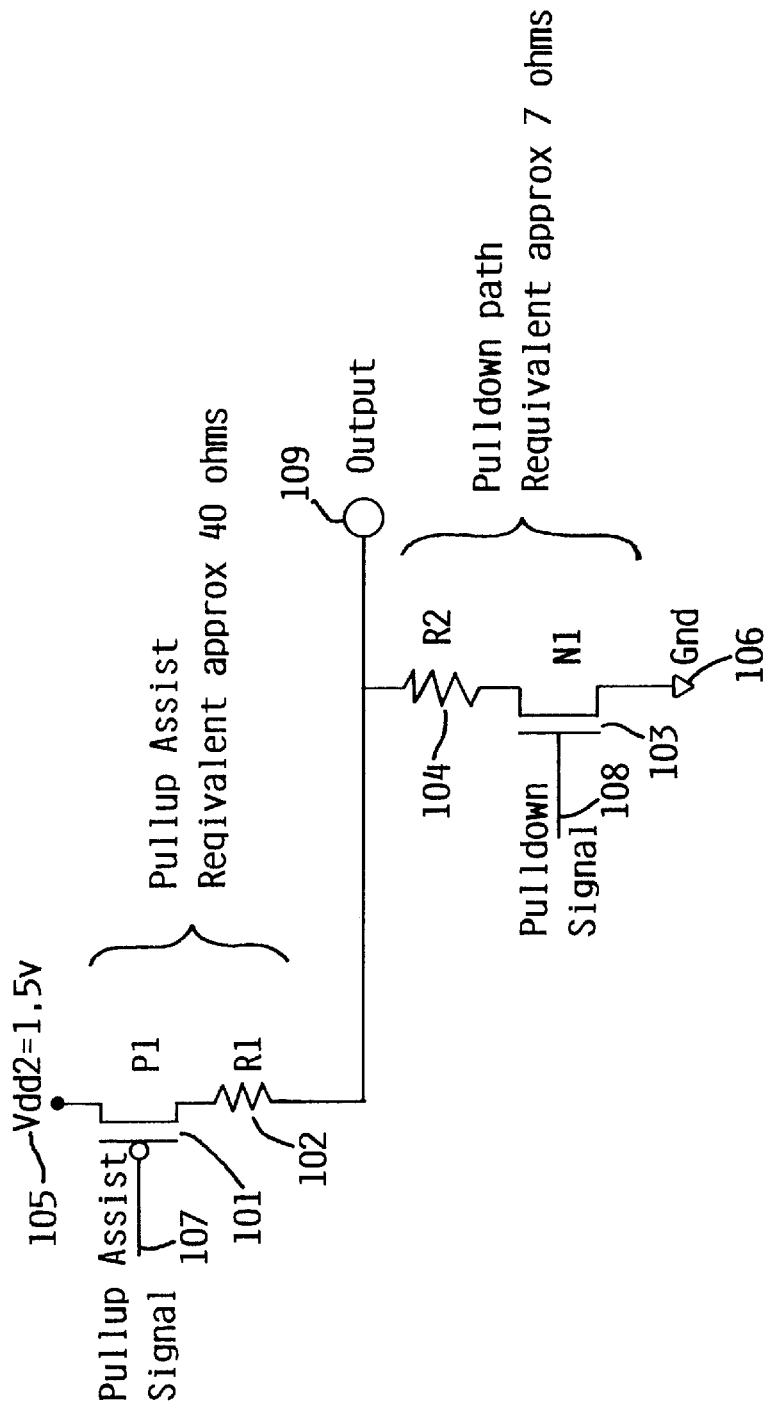
FIG. 1 illustrates a conventional assisted GTL driver.

FIG. 1 illustrates a conventional assisted gunning transceiver logic (AGTL) pull-up assist driver 101/102, for an impedance of 40 ohms and a Vdd2 105 of 1.5 volts. A pull-up assist signal at a control terminal 107 of the switching device (P1) 101 controls the switching device 101 to connect the bus (Output) 109 to the Vdd2 105 voltage of 1.5 volts through resistance (R1) 102. Pull-down is provided through pull-down path 103/104 to ground (Gnd) 106 under control of a pull-down signal at terminal 108 of the switching device (N1) 103, connecting and disconnecting the bus 109 to ground 106 through resistance 104. The pull-down path presents an impedance of approximately 7 ohms.

Figure 2:
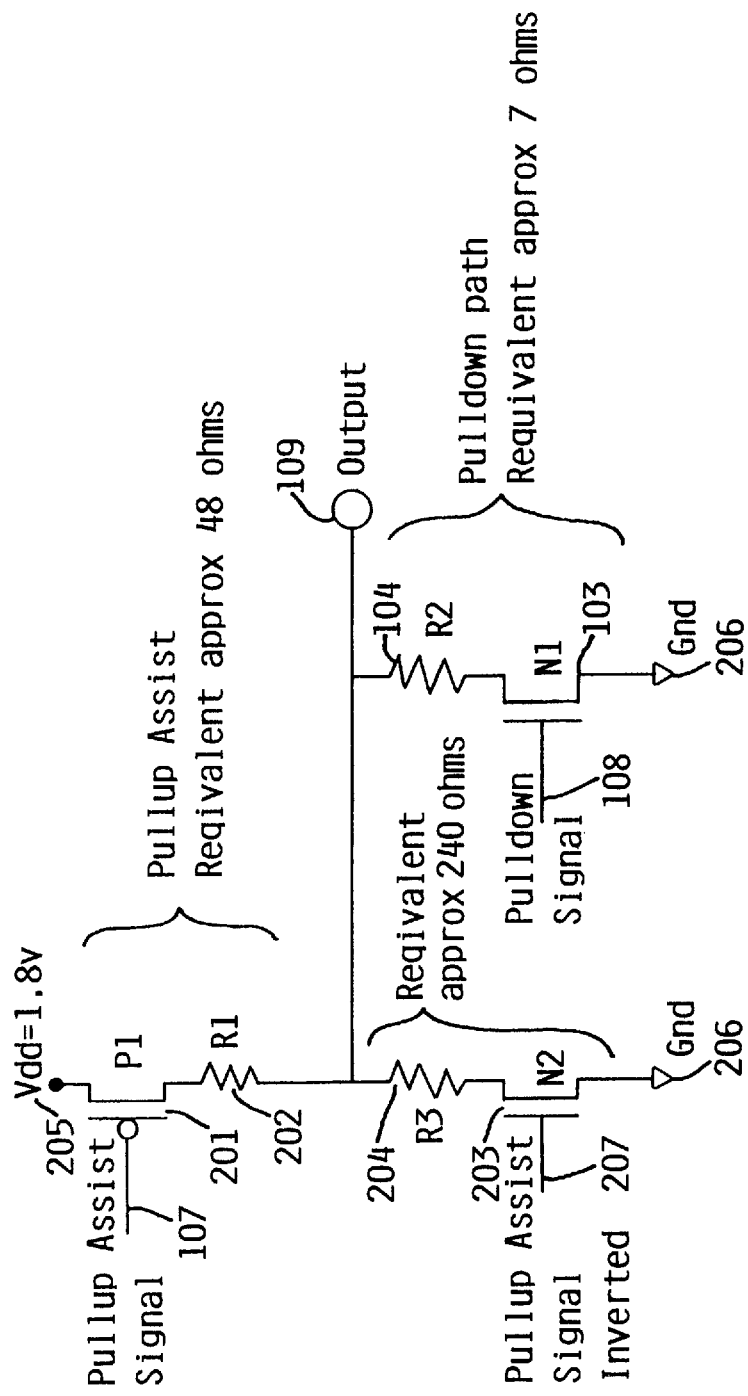
FIG. 2 illustrates a Thevenized assisted GTL driver according to an exemplary embodiment of the invention.

FIG. 2 shows an exemplary implementation according to the present invention. Similarly to the conventional circuit in FIG. 1, a pull-up assist signal at inverting terminal 107 of switching device (P1) 201 controls the switching device 107 to connect/disconnect the bus (Output) 109 to a Vdd voltage 205, which in this case is however, the "natural" 1.8 volts, through resistance (R1) 202. However, the exemplary pull-up assist driver according to the invention shown in FIG. 2 has a branch from the bus 109 to ground (Gnd) 206 as well, through resistance (R3) 204 and a second switching device (N2) 203. The pull-up assist signal, inverted, controls the second switching device (N2) 203 at terminal 207 to connect/disconnect the bus (Output) 109 to ground (Gnd) 206 potential through the resistance (R3) 204. The first and second switching devices (P1 and N2) 201 and 203 are both activated at the same time to thereby form a voltage divider (a split terminator) on the bus (Output) 109.

According to an aspect of the invention, this exemplary pull-up assist driver of FIG. 2 provides an approximate terminating resistance of 40 ohms and pull-up to approximately 1.5 volts to the bus 109. This can be readily calculated using Thevenin circuit analysis. In particular, according to the theory, to determine the Thevenin equivalent resistance, the power supply (Vdd) is considered to be a short circuit (zero impedance) and the load is considered opened (infinite impedance). In this case, the two branches of the pull-up assist driver are in parallel, and the Thevenin equivalent resistance then is the combined parallel resistance:

$$(R_{P1}+R1)\|(RN2+R3) \qquad \text{EQ. 1}$$

where $R_{P1}$ and $R_{N2}$ are the resistances of the switching devices (P1, N2) 201,204 The parallel resistances can be evaluated using a product over sum calculation.

It is also apparent that the two branches of the pull-up driver circuit provide a voltage divider. The voltage at the output with respect to ground, i.e., the Thevenin equivalent voltage, will be the voltage across the (RN2+R3) combination. Using voltage divider principles, the voltage is therefore:

$$Vdd2\times\{(Rn2+R3)/((Rn2+R3)+(Rn2+R3))\}. \qquad \text{EQ. 2}$$

Solving the two equations EQ. 1 and EQ. 2, to achieve the desired terminating impedance, e.g., 40 ohms, and the desired 1.5 volts at the output with 1.8 volts at the input, the first quantity $(R_{P1}+R1)$ is determined to be approximately 48 ohms, and the second $(R_{N2}+R3)$ approximately 240 ohms. The parallel combination of 240 ohms and 48 ohms is approximately 40 ohms:

$$(240*48)/(240+48)=40 \text{ ohms} \qquad \text{EQ. 3}$$

Further, the voltage divider provided by the two branches yields the required 1.5 volts when the input voltage is the natural 1.8 volts:

$$1.8 \text{ volts}*(240/(240+48))=1.5 \text{ volts} \qquad \text{EQ. 4}$$

The pull-up driver current path from ground 206 to Vdd 205 is through a resistance of approximately 288 ohms (240+48).

In the FIG. 2 example, the pull-down path 103/104 to ground 206 is the same as in the conventional circuit of FIG. 1, and therefore need not be explained again.

In the example shown in FIG. 2, an equivalent pull-up terminating resistance of approximately 40 ohms was the desired value; however the invention is not necessarily limited to this particular value. One skilled in the art would recognize that other values could be used to provide a pull-up assist driver for a bus having a different desired terminating impedance. Whatever this pull-up resistance is will be the Thevenized resistance of the pull-up/pull-down parallel combination according to the present invention. For example, it was mentioned earlier that there are a variety of dialects of AGTL buses, and thus, there would be a like variety of implementations of the present inventions accordingly, as would be apparent to one skilled in the art.

It should also be apparent that if a different pull-up voltage is desired, or if the input voltage is different from the 1.8 volts natural voltage shown, the circuit values would be adjusted accordingly.

The switching devices 201 and 203 could be any suitable CMOS switch, for example. In the FIG. 2 example, one switching device 201 is illustrated as a P-type field effect transistor (PFET) having an inverting input terminal 107 and the other switching device 203 as an N-type field effect transistor (NFET) having a non-inverting input terminal 207, the pull-up assist signal being inverted, e.g., by an inverter (not shown), before being applied to the latter terminal, so that both switching devices 201 and 203 are activated at the same time. As is known, a PFET is turned on by having its gate pulled down (i.e., to ground), while an NFET is turned on by having its gate pulled up (i.e., to Vdd). Therefore, to activate the pull-up driver of FIG. 2, both the PFET P1 and the NFET N2 are turned on, respectively requiring a "0" and a "1" on their gates to turn them on.

Different arrangements of the driver form the FIG. 2 implementation are possible. However, if an NFET were used in place of the pull-up transistor P1, it would pull up well until about an NFET threshold below the supply (Vdd-Vtn) at which point it would shut off and look like an open circuit. Thus, it wouldn't look like "40 ohms" for positive pulses at or near the Vdd rail voltage. If a higher voltage is available (e.g., 2.5 volts on a 1.8 volt native chip supply) it is possible that such an NFET pull-up could do an adequate job of termination. However, a 2.5 volt supply is not always used. Using a gate voltage of 2.5 volts may also raise concerns about gate voltage stress unless the gate voltage is raised so slowly that the source will be guaranteed to follow it. Therefore, such an alternate configuration falling within the spirit of the present invention may not be a first choice in a particular design. On the other hand, a PFET pull-down (replacing NFET N2 with a PFET) would only pull down to a PFET threshold above ground. This would work, but would not be a first choice in design.

Regarding the possibility of using bipolar transistors for the switching, these are not as readily available in VLSI (very large scale integration) and therefore, although within the spirit of the invention, would not be a first design choice. N2 could be replaced by an NPN-type bipolar transistor as a switch, however, P1 would be harder to replace with a bipolar transistor since the top switching device, in combination with its series resistor, needs to look like "40 ohms" both above and below the Vdd rail. Still, such modifications are considered to be within the spirit and scope of the invention described and disclosed herein.

As would be apparent to one skilled in the art, the resistances (R1 and R3) 202 and 204 could be fixed precision resistances such as are readily available as resistance networks, for example, or alternatively they could be programmable resistances. In the latter case, the programmable adjustment of the (equivalent) terminating resistance could be arranged to provide the best match for a given AGTL bus arrangement based on load, for example. Further, such a "tuning" of the termination could be dynamically adjusted based on a measured load on the bus so that the bus would provide the best possible signal transmission for a current bus load.

Figure 3:
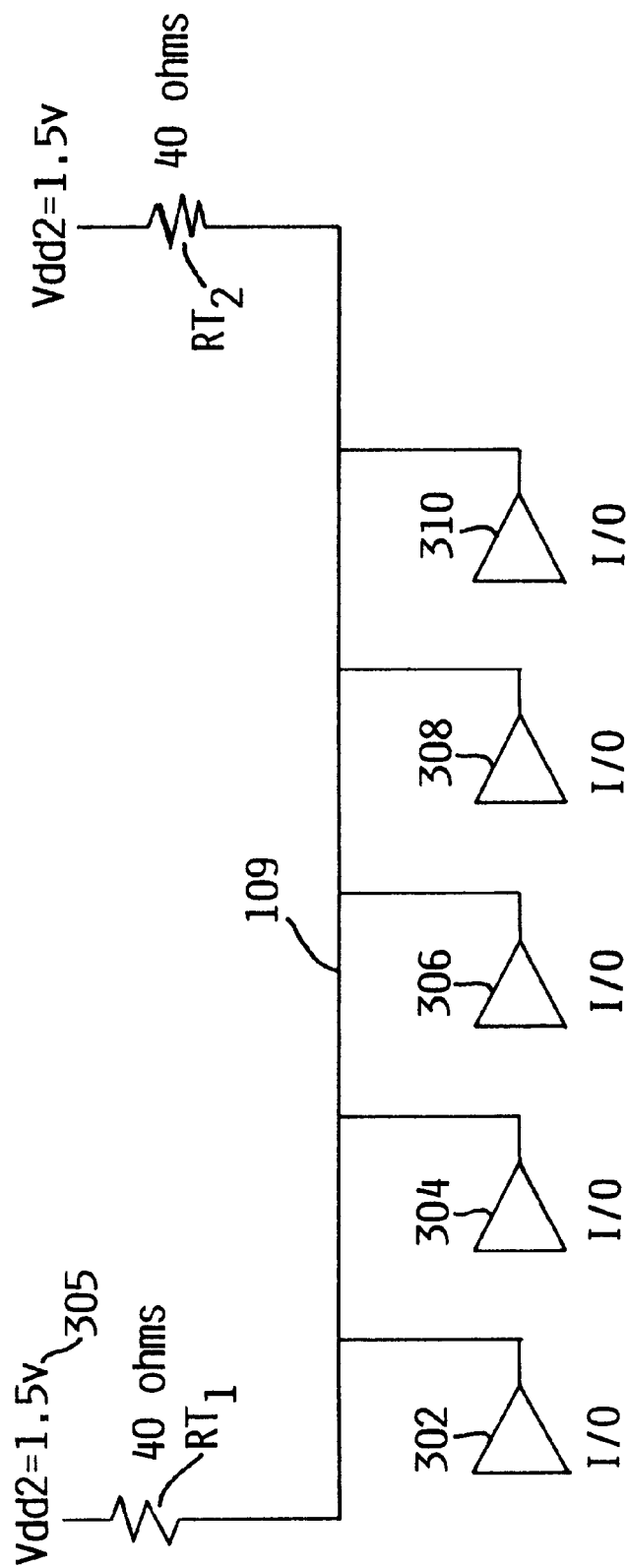
FIG. 3 illustrates an assisted GTL bus with five drops.

FIG. 3 shows a five input/output (I/O) drop AGTL bus 109 arrangement terminated at each end with 40 ohm pull-up resistances RT1 and RT2. Five I/O transceivers 302, 304, 306, 308 and 310 are shown. These transceivers 302–310 could provide an interface to the AGTL bus 109 for processor in a multiprocessor computer system, for example.

Figure 4:
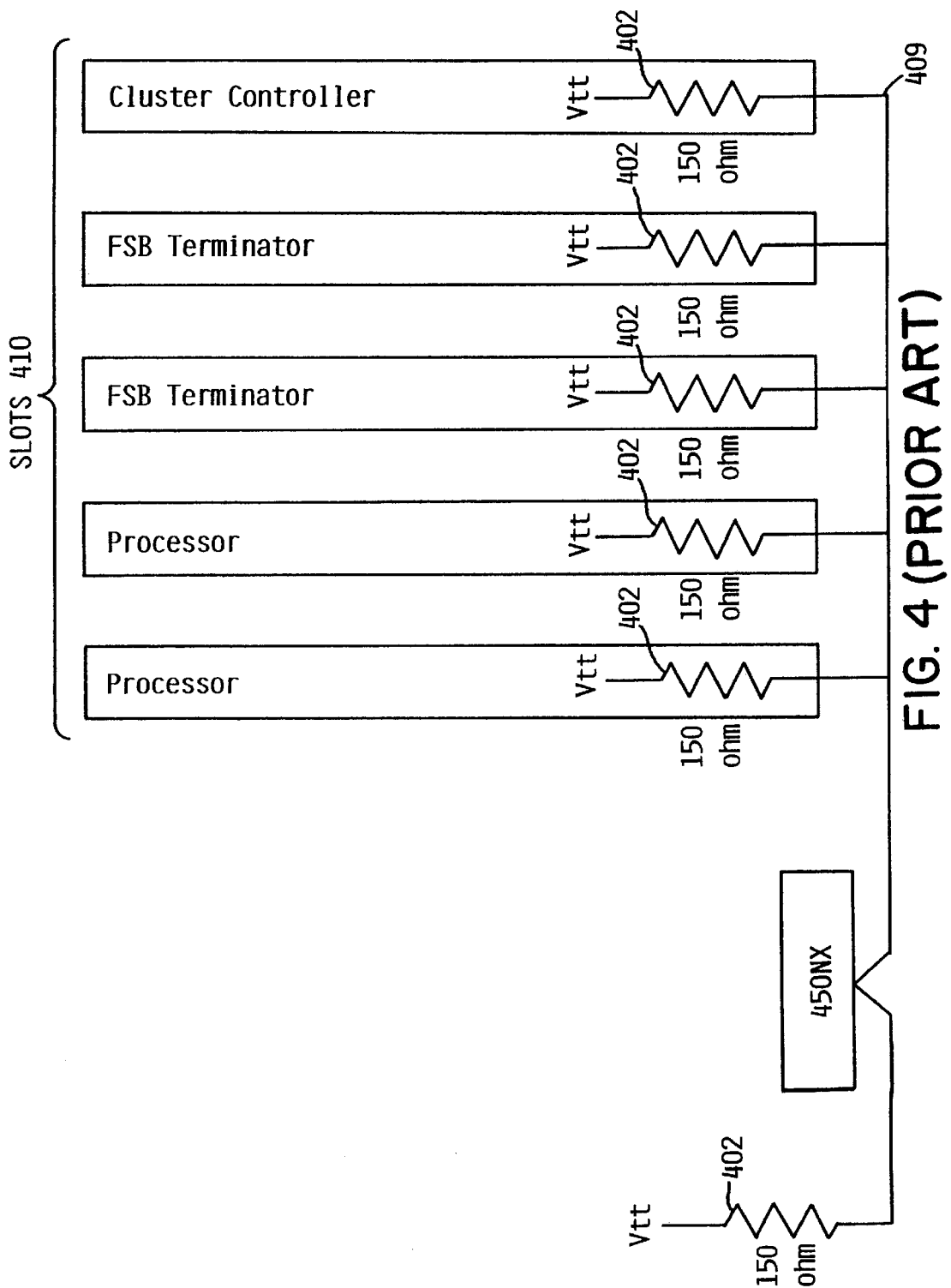
FIG. 4 illustrates a known four-way symmetric multi-processing (SMP) design example of an AGTL+bus for an Intel® Pentium® II Xeon™ processor.

FIG. 4, described above, is an example of a known four-way symmetric multi-processing (SMP) design example using an AGTL+ bus for an Intel® Pentium® II Xeon™ processor based system.

Figure 5:
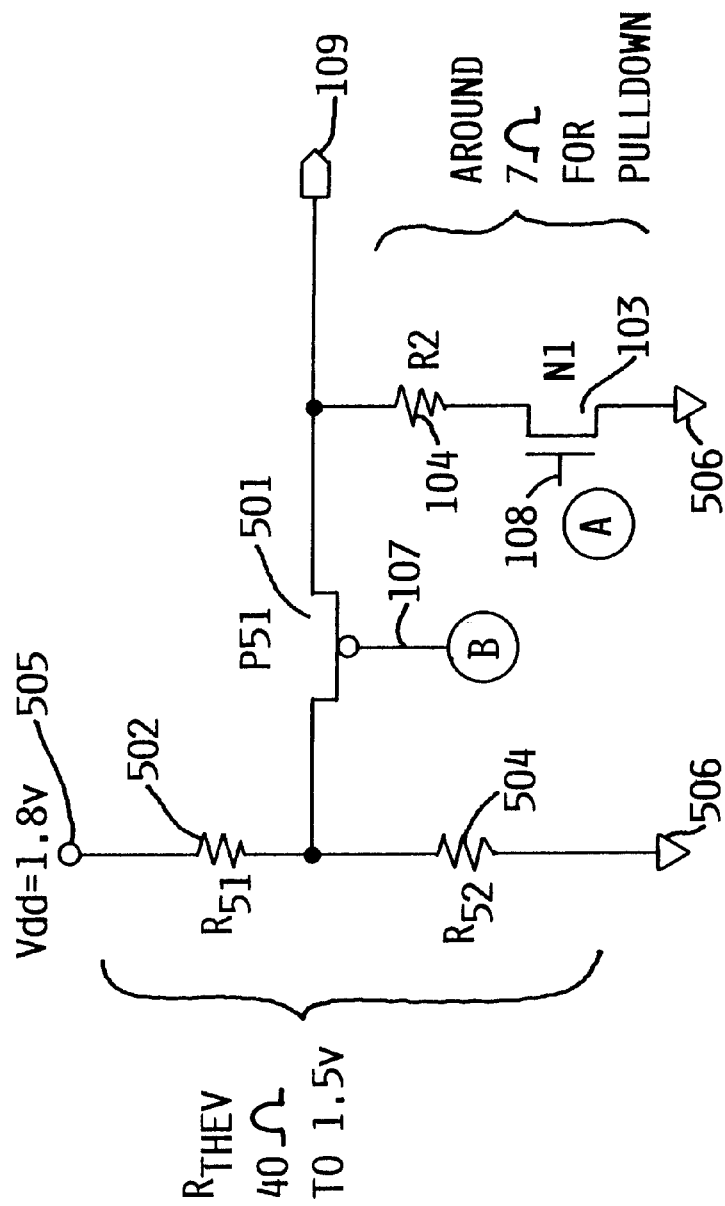
FIG. 5 illustrates an alternative exemplary embodiment of the invention.

FIG. 5 illustrates an alternate exemplary embodiment of the invention. Here, R51 502 and R52 504 provide the approximately 40 ohms Thevinized resistance and voltage divider, switched in by PFET 501 (P51). In this example, Vdd 505 is 1.8 volts with respect to ground 506. The pull-down circuitry N1 103, receiving the pull-down signal 108 at gate terminal "A," and R2 104 are configured as in the preceding drawings and need not be explained again. The pull-up signal is applied to the gate terminal 107 at point "B" of PFET 501 (P51). The pull-up signal goes low to connect the voltage divider (providing the 1.5 volts) Thevinized resistance R1 and R2 (providing the 40 ohms impedance) to the bus output 109. The PFET 501 (P51) is assumed to have a negligible ON resistance in this example. However, in reality, P51 may have a very low ON resistance, e.g., 10 ohms, so then this On resistance must be included when calculating the required 40 ohms. In that case, the parallel connection of R51 and R52 would be set to 30 ohms, which is in series with the 10 ohms ON resistance of P51.

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. A driver for a signal line, comprising a circuit coupled to the signal line and coupled to a voltage source having a first voltage level and a second voltage level, to selectively provide a pull-up voltage level to the signal line, different from the first voltage level and different from the second voltage level, and to terminate the signal line with a predetermined impedance;

wherein the circuit comprises a Thevenized split termination circuit which includes:

a first switching device, having a first terminal coupled to the first voltage level, a second terminal for receiving a pull-up assist signal, and a third terminal which is selectively electrically connected and disconnected to the first voltage level through the respective first terminal under control of the pull-up assist signal;

a first impedance, coupled between the third terminal of the first switching device and the signal line;

a second switching device, having a first terminal coupled to the second voltage level, a second terminal for receiving the pull-up assist signal, and a third terminal which is selectively electrically connected and disconnected to the second voltage level through the respective first terminal under control of the pull-up assist signal; and a second impedance, coupled between the third terminal of the second switching device and the signal line.

2. A driver according to claim 1, further comprising:

a third switching device, having a first terminal coupled to the second voltage level, a second terminal for receiving a pull-down signal, and a third terminal which is selectively electrically connected and disconnected to the second voltage level through the respective first terminal under control of the pull-down signal; and a third impedance, coupled between the third terminal of the third switching device and the signal line.

3. The driver according to claim 1, wherein the first and second switching devices are controlled by the pull-up assist signal to electrically connect their respective third terminals to the respective voltage levels at substantially the same time, whereby the first and second impedances and first and second switching devices act as a voltage divider to selectively provide the pull-up voltage level, different from the first voltage level and the second voltage level, to the signal line, and terminate the signal line with a predetermined impedance.

4. A method of terminating a bus comprising utilizing the driver according to claim 1.

5. A method of terminating a bus comprising utilizing the driver according to claim 1.

6. The driver according to claim 1, wherein the first and second switching devices comprise switching transistors.

7. The driver according to claim 1, wherein the first impedance and the first switching device together form a first branch circuit having an impedance of approximately 48 ohms; and wherein the second impedance and the second switching device together form a second branch circuit having an impedance of approximately 240 ohms;

whereby the first and second branch circuits together provide an equivalent combined impedance of 40 ohms to the signal line.

8. A method of terminating a bus comprising:

determining a desired bus terminating impedance;

determining a desired bus pull-up voltage;

determining a first relative resistance value and a second relative resistance value based on the desired bus pull-up voltage and a supply voltage from a voltage supply;

determining a first actual resistance value based on the relative resistance values already determined and the desired bus terminating impedance;

determining a second actual resistance value based on the first actual resistance value and the relative resistance values already determined; and providing a bus termination circuit having a first branch and a second branch, the first branch having the first actual resistance and the second branch having the second actual resistance, the first and second branches being connected to the bus at a first end thereof, a second end of the first branch being connected to a first terminal of the voltage supply and a second end of the second branch being connected to a second terminal of the voltage supply.

9. The method according to claim 8, wherein the providing a bus termination circuit having a first branch and a second branch further comprises:

providing a first switching device in the first branch and a second switching device in the second branch; and controlling the first and second switching devices with a pull-up assist signal so that when a logic level "1" is to be put on the bus, the pull-up assist signal causes the first and second switching devices to connect the voltage supply to the first and second resistances.

10. A driver for a signal line, comprising a circuit coupled to the signal line and coupled to a voltage source having a first voltage level and a second voltage level, to selectively provide a pull-up voltage level to the signal line, different from the first voltage level and different from the second voltage level, and to terminate the signal line with a predetermined impedance;

wherein the first voltage level is approximately 1.8 volts, wherein the second voltage level is approximately zero volts, and wherein the pull-up voltage level is approximately 1.5 volts.

11. The driver according to claim 10, wherein the predetermined signal line impedance is approximately 40 ohms.

12. The driver according to claim 1, wherein the signal line comprises an assisted Gunning transceiver logic bus.

13. A driver for a signal line, comprising a circuit coupled to the signal line and coupled to a voltage source having a first voltage level and a second voltage level, to selectively provide a pull-up voltage level to the signal line, different from the first voltage level and different from the second voltage level, and to terminate the signal line with a predetermined impedance;

wherein the circuit comprises a Thevenized split termination circuit which includes:

a voltage divider having a first terminal coupled to the first voltage level, a second terminal, and a third terminal coupled to the second voltage level; and a first switching device, having a first terminal coupled to the second terminal of the voltage divider, a second terminal for receiving a pull-up assist signal, and a third terminal coupled to the signal line;

wherein the second terminal of the voltage divider is selectively connected and disconnected to the signal line through the first switching device under control of the pull-up assist signal;

whereby the voltage divider selectively provides the pull-up voltage level, different from the first voltage level and the second voltage level, to the signal line, and terminates the signal line with a predetermined impedance.

14. The driver according to claim 13, further comprising a pull-down circuit including:

a second switching device, having a first terminal coupled to the second voltage level, a second terminal for receiving a pull-down signal, and a third terminal which is selectively electrically connected and disconnected to the second voltage level through the respective first terminal under control of the pull-down signal; and an impedance, coupled between the third terminal of the second switching device and the signal line.

15. A method of terminating a bus comprising utilizing the driver according to claim 14.

16. A method of terminating a bus comprising utilizing the driver according to claim 13.

17. The driver according to claim 13, wherein the first and second switching devices comprise switching transistors.

18. The driver according to claim 17, wherein the first and second switching devices comprise field effect transistors.

19. The driver according to claim 13, wherein the voltage divider and the first switching device together provide an equivalent combined impedance of 40 ohms to the signal line.

20. The driver according to claim 19, wherein the first voltage level is approximately 1.8 volts, wherein the second voltage level is approximately zero volts, wherein the pull-up voltage level is approximately 1.5 volts, and wherein the signal line comprises an assisted Gunning transceiver logic bus.

* * * * *

UNITED STATES PATENT AND TRADEMARK OFFICE
CERTIFICATE OF CORRECTION

PATENT NO.    : 6,222,389 B1
DATED         : April 24, 2001
INVENTOR(S)   : Robert Russell Williams It is certified that error appears in the above-identified patent and that said Letters Patent is hereby corrected as shown below:

<u>Column 10,</u>
Lines 36-37, replace
"The driver according to Claim 1, wherein the signal line comprises an assisted Gunning transceiver logic bus." with
-- A driver for a signal line, comprising a circuit coupled to the signal line and coupled to a voltage source having a first voltage level and a second voltage level, to selectively provide a pull-up voltage level to the signal line, different from the first voltage level and different from the second voltage level, and to terminate the signal line with a predetermined impedance;
   wherein the signal line comprises an assisted Gunning transceiver logic bus. --

Signed and Sealed this

Twenty-seventh Day of August, 2002

*Attest:*

JAMES E. ROGAN
*Attesting Officer*   *Director of the United States Patent and Trademark Office*